United States Patent
Snyder et al.

(10) Patent No.: US 6,916,679 B2
(45) Date of Patent: Jul. 12, 2005

(54) METHODS OF AND DEVICE FOR ENCAPSULATION AND TERMINATION OF ELECTRONIC DEVICES

(75) Inventors: Shawn W. Snyder, Golden, CO (US); Pawan K. Bhat, Littleton, CO (US); Shefall Jaiswal, Lakewood, CO (US)

(73) Assignee: Infinite Power Solutions, Inc., Golden, CO (US)

( * ) Notice: Subject to any disclaimer, the term of this patent is extended or adjusted under 35 U.S.C. 154(b) by 148 days.

(21) Appl. No.: 10/215,190

(22) Filed: Aug. 9, 2002

(65) Prior Publication Data

US 2004/0029311 A1 Feb. 12, 2004

(51) Int. Cl.$^7$ .................................. H01L 21/00
(52) U.S. Cl. ..................... 438/64; 438/65; 438/69; 438/51; 438/55; 429/305; 429/306; 429/310; 429/311; 259/251
(58) Field of Search .................. 438/64, 65, 69, 438/51, 55; 429/305, 306, 310, 311; 136/259, 251

(56) References Cited

U.S. PATENT DOCUMENTS

| | | | |
|---|---|---|---|
| 4,127,424 A | * | 11/1978 | Ullery, Jr. ............... 136/244 |
| 4,481,265 A | * | 11/1984 | Ezawa et al. ............ 429/9 |
| 4,555,456 A | | 11/1985 | Kanehori et al. |
| 4,740,431 A | * | 4/1988 | Little ...................... 429/9 |
| 5,110,696 A | | 5/1992 | Shokoohi et al. |
| 5,171,413 A | | 12/1992 | Arntz et al. |
| 5,338,625 A | | 8/1994 | Bates et al. |
| 5,411,592 A | | 5/1995 | Ovshinsky et al. |
| 5,445,906 A | | 8/1995 | Hobson et al. |
| 5,470,396 A | * | 11/1995 | Mongon et al. ........ 136/251 |
| 5,512,147 A | | 4/1996 | Bates et al. |
| 5,512,389 A | | 4/1996 | Dasgupta et al. |
| 5,552,242 A | | 9/1996 | Ovshinsky et al. |
| 5,561,004 A | | 10/1996 | Bates et al. |
| 5,567,210 A | | 10/1996 | Bates et al. |
| 5,599,355 A | | 2/1997 | Nagasubramanian et al. |
| 5,645,960 A | | 7/1997 | Scrosati et al. |
| 5,705,293 A | | 1/1998 | Hobson |
| 5,755,940 A | | 5/1998 | Shindo |
| 5,834,137 A | | 11/1998 | Zhang et al. |
| 5,895,731 A | | 4/1999 | Clingempeel |
| 5,961,672 A | | 10/1999 | Skotheim et al. |
| 6,030,421 A | * | 2/2000 | Gauthier et al. .......... 29/623.1 |
| 6,045,942 A | * | 4/2000 | Miekka et al. ............ 429/124 |
| 6,080,508 A | | 6/2000 | Dasgupta et al. |
| 6,120,890 A | | 9/2000 | Chen et al. |
| 6,168,884 B1 | | 1/2001 | Neudecker et al. |
| 6,175,075 B1 | * | 1/2001 | Shiotsuka et al. ......... 136/251 |
| 6,218,049 B1 | | 4/2001 | Bates et al. |
| 6,242,129 B1 | | 6/2001 | Johnson |

(Continued)

FOREIGN PATENT DOCUMENTS

| | | |
|---|---|---|
| JP | 60068558 | 4/1985 |
| WO | WO 98/47196 | 10/1998 |
| WO | WO 00/60682 | 10/2000 |
| WO | WO 01/17052 A2 | 3/2001 |

Primary Examiner—David Zarneke
Assistant Examiner—Victor V. Yeksikov
(74) Attorney, Agent, or Firm—Schwartz Sung & Webster

(57) ABSTRACT

A novel method for production of and an apparatus for an encapsulated solid-state electrochemical device is disclosed. The present invention provides for electrical devices, such as, for example, thin-film batteries with sensitive chemistries that can survive environmental exposure while providing external electrical contact to the internal cell chemistry. The method of packaging of the present invention may include bonding one or more protective multi-layer laminates to the environmentally sensitive surfaces of an electronic device. The present invention may provide the advantage of avoiding entrapped air beneath the laminates.

46 Claims, 6 Drawing Sheets

U.S. PATENT DOCUMENTS

| | | | |
|---|---|---|---|
| 6,280,875 B1 | | 8/2001 | Kwak et al. |
| 6,323,416 B1 | * | 11/2001 | Komori et al. ............. 136/259 |
| 6,369,316 B1 | * | 4/2002 | Plessing et al. ............. 136/251 |
| 6,376,027 B1 | | 4/2002 | Lee et al. |
| 6,380,477 B1 | * | 4/2002 | Curtin ........................ 136/244 |
| 6,413,285 B1 | * | 7/2002 | Chu et al. .................. 29/623.4 |
| 6,664,006 B1 | * | 12/2003 | Munshi ....................... 429/305 |
| 2001/0054437 A1 | * | 12/2001 | Komori et al. ............. 136/259 |
| 2003/0029493 A1 | * | 2/2003 | Plessing ..................... 136/251 |
| 2003/0091904 A1 | * | 5/2003 | Munshi ....................... 429/309 |
| 2003/0109903 A1 | * | 6/2003 | Berrang et al. ............... 607/36 |

* cited by examiner

METHODS OF AND DEVICE FOR ENCAPSULATION AND TERMINATION OF ELECTRONIC DEVICES

BACKGROUND OF THE INVENTION

1. Field of the Invention

The present invention relates to a novel method for production of and an apparatus for encapsulation and termination of devices, including electronic or electrochemical device. The present invention provides, for example, for electrochemical devices, such as, for example, thin-film batteries with sensitive chemistries that can survive environmental exposure while providing external electrical contact to the internal cell chemistry. The method of packaging of the present invention may include bonding one or more protective multi-layer laminates to the environmentally sensitive surfaces of an electronic device. The present invention can provide the advantage of avoiding or reducing entrapped air beneath the laminates.

2. Description of the Art

One category of encapsulated electrochemical devices includes lithium-ion ("Li-ion") batteries. One standard structure used to encapsulate solid-state Li-ion batteries incorporates a parylene/copper multi-layer. Although such structures may be somewhat impermeable under standard ambient conditions, they are poor protectors when exposed to elevated temperature and humidity. Another encapsulation method for Li-ion thin-film batteries entails the use of a multi-layer bag and a bonding adhesive or thermal plastic that is edge-sealed to produce a closed bag enclosure. In these types of enclosures the bonding adhesive or thermal plastic is the weak point. More importantly, the gas in such a sealed bag may expand at elevated temperatures resulting in a seam breach. Transport of such a sealed bag to a high altitude may create a similar risk of seam breach due to differential pressure bag expansion.

Another category of encapsulated electrochemical devices includes lithium batteries. Lithium batteries have been available with a liquid electrolyte for some time. However, lithium batteries have only recently been manufactured in a solid-state configuration. Among the challenges of producing such solid-state batteries is creating a product with a long functional life.

Thin-film batteries that contain materials like lithium that react when exposed to water or air must be thoroughly shielded or encapsulated from those environments. One such encapsulation approach is described in U.S. Pat. No. 5,561,004, wherein parylene, metal, or ceramic layer combinations are employed to produce a thin-film barrier. The parylene metal encapsulant claimed in this patent, however, is not capable of protecting cells at 85° C./85% relative humidity accelerated life testing for more than one hour. Another encapsulation approach is described in U.S. Pat. No. 6,080,508, wherein encapsulation is attempted by use of an edge-sealed multi-layer pouch with insulating strips used to protect the conductor leads from shorting through the metal layer of the pouch during final edge sealing. However, when exposed to 85° C./85% relative humidity for less than 24 hours, such encapsulant pouches tend to experience seam breakage, greatly reducing their potential utility.

SUMMARY OF THE INVENTION

The present invention relates to the design and manufacture of and includes a novel high-capacity solid-state encapsulated electrochemical device and cell termination device and means as are, for example, disclosed. One embodiment of the present invention can survive and continue to provide environmental protection for more than two weeks at 85° C./85% relative humidity to, for example, electrochemical device materials, such as lithium. An example of an electrochemical device may be a power device such as, for example, a thin-film battery. Other encapsulated electrochemical devices may be, for example, solid-state batteries and photovoltaic cells, superconducting devices, synthetic multi-functional materials, as well as, fiber reinforced composite material applications.

The present invention enables, for example, electrochemical power devices with sensitive chemistries to survive environmental exposure while providing external electrical contact to the internal cell chemistry. The packaging approach of the present invention may include bonding one or more protective multi-layer laminates to the environmentally sensitive surfaces of the electronic device. The avoidance of entrapped air beneath the laminate may be one advantage of the present invention.

Electronics applications in which a power device such as, for example, a battery, needs environmental protection also sometimes require electrical contacts to be brought out through the boundary of the encapsulation as depicted in an embodiment of the invention. To achieve extremely long life power devices (100,000+ cycles), special attention should be given to the methodology utilized for the encapsulation and electronic termination. Indeed, environmental contact is one of the biggest causes of cell failure over long use or storage periods.

An embodiment of the present invention may employ terminations or contacts that are bonded and exit, or are exposed, either through an edge seam or a cut opening of an encapsulated dual or single-sided laminate structure, or through an underlying substrate by way of a metallic via (metal-filled through-hole). The ability to encapsulate lithium in an electrochemical power device, for example, a thin-film battery has heretofore been accomplished primarily through simple edge sealing. This "bagging" process creates an air pocket that expands at high temperatures, or differential pressures, thus risking seam breach with resultant cell failure. One advantage of the present invention is that seam failure can be avoided by bonding laminate materials to a significant portion of the battery surface. The product life span of the present invention may be expected to exceed the life span of current products, such as, for example, the typical three-year life span of current lithium products.

To prevent lithium and lithium-phosphorous-oxynitride ("LiPON") from dissolving in or corroding due to exposure to air (especially oxygen, nitrogen or water vapor), a barrier may, pursuant to an embodiment of the present invention, be placed between these sensitive materials and the ambient atmosphere. The entrapment of air within the package may advantageously be minimized during processing. This technique may provide the additional advantage of preventing the buildup of internal pressure caused by thermal gaseous expansion or a differential pressure change once the package has been closed.

One approach pursuant to an embodiment of the present invention to avoid entrapment of air within the package during the lamination process may include bonding a multi-layered laminate material to the entire or a substantial portion of the surface of the electronic device. This approach may add to the seal length of the cell. Furthermore, this approach may avoid a point failure that exposes the internal cell pocket of a typical bag-sealed, edge-crimped style enclosure to the environment. Employing this method may add robustness to the package. Moreover, the full or substantial portion approach of surface bonding should enhance the environmental resistance of the sealed system.

One embodiment of a preferred multi-layered laminate of the present invention may contain a metal layer such as, for example, aluminum. Other materials that may also be used are, for example, copper, stainless steel, titanium, nickel, chromium, silver, gold, indium, magnesium, and calcium. Alternatively, a multi-layered laminate containing a nonporous glass layer may provide similar protection. A metal layer used as the barrier layer in the multi-layered laminate may provide a convenient, yet undesirable, shorting path for the cell. Accordingly, the present invention in certain embodiments may employ various means to address this potential shorting.

One way to address potential shorting may include adapting process parameters. For example, in the bond layer in one embodiment of the present invention, the encapsulant may be a thermal adhesive and consequently an insulator. During the encapsulant thermal lamination process, the bond layer may extrude out from beneath the barrier layer, thus naturally insulating the edges of the barrier layer from providing a shorting path. The top layer of the laminate materials may also be a slip type film that may provide basic mechanical protection for the barrier layer.

The manner of connecting the electronic device of an embodiment of the present invention to an electrical circuit should be considered when providing a contact means to a cell that is to be isolated from the environment. One approach for embodiments of electrochemical devices of the present invention may be to use wire-bonding. For example, aluminum, gold, and copper may be used for wire-bonding. Other techniques for bonding that may be used in embodiments of the present invention are, for example, using conductive adhesive, conductive epoxy, conductive ink, and cured conductor composition paste, and further techniques such as, for example, spot welding, soldering, and ultrasonic bonding of metals.

The battery structure of an embodiment of the present invention, for example, may be fabricated by layering materials upon a prepared substrate. The substrate materials may include, but are not limited to, ceramic, plastic, or metallic materials. The conductive nature of the substrate may be considered when selecting the contact and the encapsulation materials.

Deposition of a material on a surface of an embodiment of an electrochemical device of the present invention may be contained to a specific area through several techniques. Deposition techniques that may be used in various embodiments of the present invention include, for example, shadow-masking, screen printing, material removal, or full area coverage.

One embodiment of the present invention may be an encapsulated electrochemical apparatus having a device having a first surface and a first laminate, wherein the laminate may be bonded to a substantial portion of the first surface.

A further embodiment of the present invention may be an apparatus further having a second surface and a second laminate layer, wherein the second laminate layer may be bonded to the second surface of the device. In this embodiment, the first and the second laminate layers may be connected.

Another embodiment of the present invention may be an apparatus having a thin-film electrochemical device.

In embodiments of the present invention, laminate layers may be connected by techniques such as embossing, crimping, and fusing.

In embodiments of the present invention, the device may be selected from a group consisting of a battery, for example, a lithium battery, and a solar cell.

In embodiments of the invention, the apparatus may further have one or more thin-film layers formed on a prepared substrate on the device.

In an embodiment of the present invention, the apparatus may further have a bonded contact attached to the device. In this embodiment, the contact may be bonded to a substrate on the device with a conductor composition paste. In this embodiment, the first laminate layer may have a pre-cut opening corresponding to the location of a contact.

In a further embodiment of the present invention, the apparatus may have a via through the substrate on the device. In this embodiment, the apparatus may further have a contact connected to the via on the device. In this embodiment, the contact may be located on a second surface of the device.

In another embodiment of the present invention, the substrate may be of a material selected from a group consisting of a ceramic, a plastic, and a metal.

In another embodiment of the present invention, the first laminate layer on the device may be a multi-layered laminate.

In a further embodiment of the present invention, the first laminate layer on the device may be a metal layer. In this embodiment, the metal layer on the device may be a material selected from a group consisting of aluminum, copper, stainless steel, titanium, nickel, chromium, silver, gold, barrier layer, indium, magnesium, and calcium.

In another embodiment of the present invention, the first laminate layer on the device may be a slip-type film layer.

In a further embodiment of the present invention, the first laminate layer on the device may be bonded to the first surface by electrical bonding. In this embodiment, the bonding may be achieved by a technique such as wire-bonding, using conductive adhesive, using conductive epoxy, using conductive ink, using cured conductor composition paste, spot welding, soldering, and ultrasonic bonding of metals. In this embodiment, the conductor may extend through an edge seal of the first laminate layer.

In one embodiment of the present invention, a conductor may be electrically bonded to the contact on the device. In this embodiment, the first surface of the device may be planar. In this embodiment, the bonding may be to a substantial portion of the first surface and may be a full planar surface bonding.

In a further embodiment of the present invention, the first laminate layer on the device may comprise one or more sublayers selected from a group consisting of a sealant layer for thermal or adhesive bonding, a tie layer, a metallic layer, a plastic layer, and a glass barrier layer.

In another further embodiment of the present invention, the laminate layer on the device may be bonded by a technique selected from a group consisting of compressive force lamination, elevated temperature lamination, roll lamination, and vacuum bag lamination.

In another embodiment of the present invention, the first laminate layer on the device may be adapted to comprise an aperture.

In one embodiment of the present invention, the apparatus may further comprise a mechanical connector affixed to the first surface of the device.

In one further embodiment of the present invention, the apparatus may comprise a contact attached to the device. In this embodiment, the contact may be a metal contact. In this embodiment, the contact may further be formed by deposition to the substrate of the device.

In one embodiment of the present invention, the apparatus may further comprise a first contact connected to a second contact attached to the device. In this embodiment, the first contact may be a metal contact. In this embodiment, the second contact may be a bonded contact. In this embodiment, the apparatus may further comprise a copper-coated polyimide element tack-bonded to the contact. In this embodiment, the copper-coated polyimide element may be tack-bonded with conductive ink. Further, in this embodiment the first laminate layer is adapted to cover the ink and the copper-coated polyimide.

In another embodiment of the present invention, the apparatus may further comprise an adhesive backed conductive metal tape affixed to the first surface of the device.

In a further embodiment of the present invention, the apparatus may comprise an over-layer laminate bonded to the device.

In yet another embodiment of the present invention, the apparatus may comprise an outer encapsulant affixed to the surface further encapsulating the device. In this embodiment, the outer encapsulant material may be selected from a group consisting of ceramic, plastic, and metal.

In one embodiment of the present invention, the encapsulated device may contain less than about 50 percent encapsulated gas per unit volume. Preferably the encapsulated device may contain less than about 10 percent encapsulated gas per unit volume. Yet more preferably, the encapsulated device may contain less than about 1 percent encapsulated gas per unit volume. Certain embodiments (as exemplified by FIGS. 1–6) have been demonstrated to contain negligible amounts of encapsulated gas. Indeed, by using the method of the current invention employing a lamination technique performed in an evacuated environment, embodiments of the apparatus of the present invention have been produced in which no encapsulated gas was detectable.

One embodiment of the present invention may be a method for producing an encapsulated electrochemical device having the steps of providing an electrochemical device, providing a first laminate layer, and bonding the first laminate layer to a substantial portion of a first surface of the electrochemical device.

In a further embodiment of the present invention, the method comprises the steps of providing a second laminate layer and bonding the second laminate layer to a second surface of the device. This embodiment may further comprise a step of connecting the first and the second laminate layers. In this embodiment, the step of connecting may be accomplished by a technique selected from a group consisting of embossing, crimping, and fusing.

In another embodiment of the present invention, one or more thin-film layers may be formed on a prepared substrate.

One embodiment of the present invention may comprise the step of attaching a bonded contact to the device. In this embodiment, the step of attaching may comprise selectively coating a substrate with a conductor composition paste.

A further embodiment of the present invention comprises the step of providing the first laminate layer with a pre-cut opening corresponding to the location of a contact.

Another embodiment of the present invention comprise the step of providing a via through the substrate. This embodiment may further comprise the step of connecting a contact to the via.

One embodiment of the present invention may comprise locating the contact on a second surface of the device.

In embodiments of the present invention, the substrate comprises a material selected from a group consisting of a ceramic, a plastic, and a metal. In this embodiment, a first laminate layer may comprise a multi-layered laminate.

In embodiments of the present invention, the first laminate layer comprises a metal layer. In this embodiment, the metal layer may comprise a material selected from a group consisting of aluminum, copper, stainless steel, titanium, nickel, chromium, silver, gold, barrier layer, indium, magnesium, and calcium.

In one embodiment of the present invention, the first laminate layer may comprise a slip-type film layer.

In another embodiment of the present invention, the step of bonding the first laminate layer may comprise electrical bonding. In this embodiment, the bonding comprises a technique selected from a group consisting of wire-bonding, using conductive adhesive, using conductive epoxy, using conductive ink, using cured conductor composition paste, spot welding, soldering, and ultrasonic bonding of metals.

In an embodiment of the present invention, the method may further comprise the step of electrically bonding a conductor to the contact. In this embodiment, the step of electrically bonding may comprise the step of extending the conductor through an edge seal of the first laminate layer.

In embodiments of the present invention, the first surface may be planar. In this embodiment, the step of electrically bonding may comprise full planar surface bonding to a substantial portion of a first surface of the device.

In another embodiment of the present invention, the first laminate layer may comprise one or more layers selected from a group consisting of a sealant layer for thermal or adhesive bonding, a tie layer, a metallic layer, a plastic layer, a glass barrier layer, and an enhanced quality layer.

In one embodiment of the present invention, the step of bonding may be accomplished by a technique selected from a group consisting of compressive force lamination, elevated temperature lamination, roll lamination, heated roll, and vacuum bag lamination.

In a further embodiment of the present invention, the first laminate layer may be adapted to comprise an aperture prior to being bonded to the device.

One embodiment of the present invention may further comprise the step of affixing a mechanical connector to the first surface.

Another embodiment of the present invention may further comprise the step of providing a contact attached to the device. In this embodiment, the contact may be a metal contact. This embodiment may further comprise the step of attaching the contact to the device by deposition of a material on the first surface of the device.

One embodiment of the present invention comprises connecting a first contact to a second contact of the device. In this embodiment, the first contact may be a metal contact. In this embodiment, the second contact may be a bonded contact.

In one embodiment of the present invention, the method further comprises the step of tack-bonding a copper-coated polyimide element to the contact. In this embodiment the step of tack-bonding the polyimide element may be accomplished by tack-bonding with conductive ink. This embodiment may further comprise the step of adapting the first laminate layer to cover the ink and the copper-coated polyimide element.

Another embodiment of the present invention comprises the step of affixing an adhesive backed conductive metal tape to the first surface.

One embodiment of the present invention comprises providing an over-layer laminate to the first surface of the device.

A further embodiment comprises affixing an outer encapsulant material to the surface, further encapsulating the device. In this embodiment, the outer encapsulant material may be selected from a group consisting of ceramic, plastic, and metal.

In one embodiment of the present invention, the encapsulated device may include less than about 50 percent encapsulated gas per unit volume. Preferably the encapsulated device may include less than about 10 percent encapsulated gas per unit volume. Yet more preferably, the encapsulated device may include less than about 1 percent encapsulated gas per unit volume.

A further embodiment of the present invention comprises the steps of providing exposure for the contact through pre-cut openings in the laminate layer and providing wire-bonding means to the contact.

In another embodiment of the present invention, the step of bonding may further comprise the step of overlaying the first laminate layer with a conformal material during at least a portion of the step of bonding.

In one embodiment of the present invention, the step of bonding may comprise displacing air by using compliant sheet materials on the opposite side of the first laminate from the device during at least a portion of the step of bonding.

In embodiments of the present invention, the step of bonding may further comprise displacing air by using a vacuum laminator during at least a portion of the step of bonding.

In one embodiment of the present invention, the step of bonding may further comprise monitoring shorting by depression control.

In another embodiment of the present invention, the step of monitoring shorting comprises the steps of monitoring the amount of pressure applied, monitoring the temperature at which the process is performed, monitoring the conformity of the compressive surface, and monitoring the amount of time for which these forces are applied.

It is understood that both the foregoing general description and the following detailed description are exemplary and explanatory only and are not restrictive of the invention as claimed. The invention is described, for example, in terms of a thin-film battery, however, one skilled in the art will recognize that the present invention can be applied to other electronic devices. The accompanying drawings illustrating an embodiment of the invention and together with the description serve to explain the principles of the invention.

DETAILED DESCRIPTION OF THE EMBODIMENTS

It is to be understood that the present invention is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "a substrate" is a reference to one or more substrates and includes equivalents thereof known to those skilled in the art.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. All references cited herein are incorporated by reference herein in their entirety.

Figure 1:
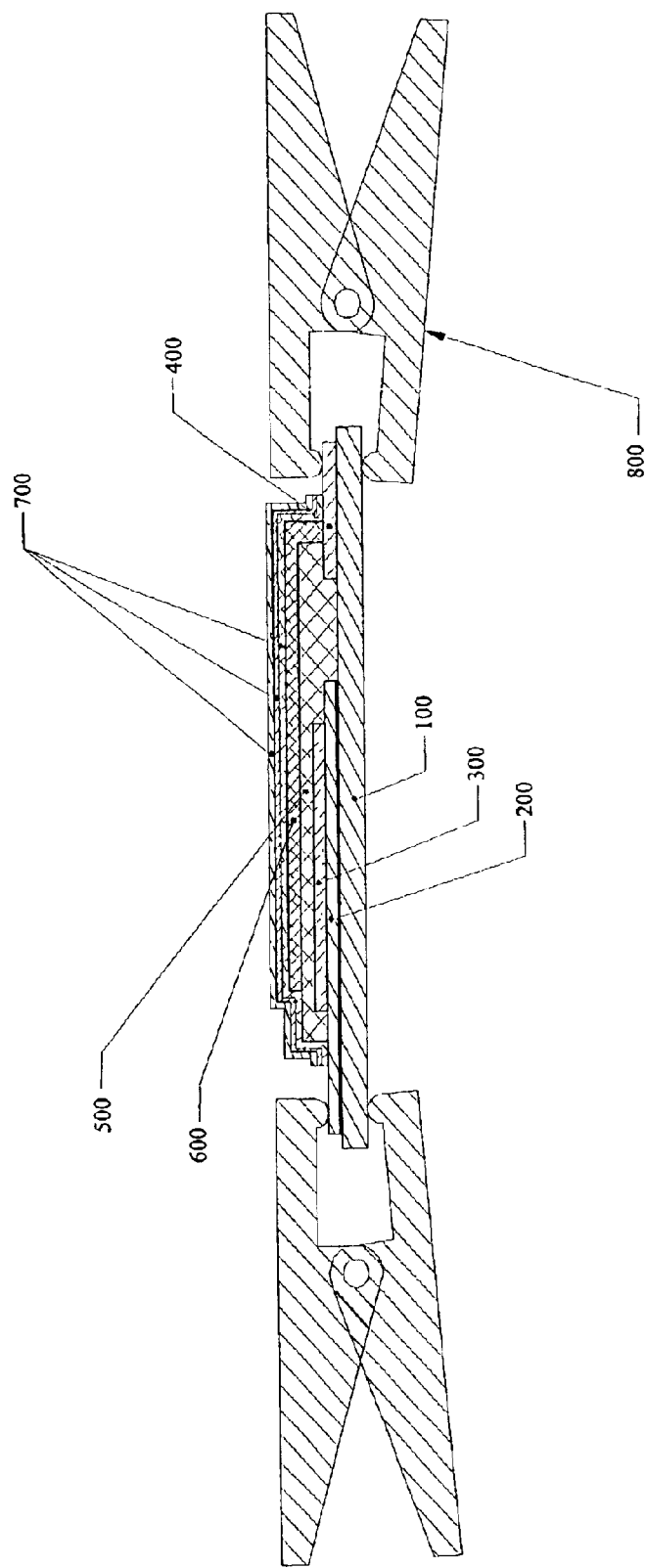
FIG. 1 is a side view cutaway diagram of an embodiment of the present invention including a deposited metallic contact with mechanical termination.

The process of manufacturing an embodiment of an electrochemical battery cell of the present invention may be performed in several ways. For example, as depicted in FIG. 1, a substrate (100) is provided that may include a number of material, such as, for example, metal, ceramic, or plastic. Depending on the specific substrate, additional layers of material may be provided to protect the electrochemical device. As described herein, such additional layers may be considered to be a part of the substrate (100).

In one embodiment of the present invention, for example, as depicted in FIG. 1, a cathode current collector (ccc) (200) may be deposited upon the substrate (100). This ccc layer may include a metal from the group Co, Au, Ni, and Ag, or any conductor that is non-alloying with lithium. The ccc layers may be deposited onto a surface using techniques such as DC sputtering or evaporation under vacuum.

In an embodiment of the present invention, as depicted in FIG. 1, a cathodic electrode (300) may be deposited over a substantial portion of the ccc layer (200). One example of a material used as a cathodic electrode that may be used in the present invention is an amorphous lithium cobalt dioxide ("$LiCoO_2$"). Methods of the $LiCoO_2$ vacuum deposition that may be used in embodiments of the present invention may include, for example, RF sputtering. Prior to adding other layers to the structure of the electrochemical device, the $LiCoO_2$ cathodic electrode (300) may be annealed by crystallization. Crystallization annealing may be achieved by, for example, cycling the substrate to approximately 700° C. through a gradual heating and cooling furnace process. Other means of producing the desired crystalline structure of the cathodic electrode may also be utilized.

A metallic contact layer (400) may also be isolated from previously deposited layers of the electronic device of an embodiment of the present invention for later contact to the anode. This metallic contact layer (400) may include, for example, a metal from the group Co, Au, Ni, and Ag, or any conductor that is non-alloying with lithium.

As depicted in FIG. 1, an electrolytic layer (500) may also be deposited on the device. The order of deposition of contact layer (400) and electrolytic layer (500) is not important. This electrolytic layer (500), preferably a lithium phosphorous oxynitride, is preferably deposited to substantially or approximately cover the entire ccc (200) and cathodic electrode (300) layers, and a substantial portion of the remaining surface area of the electronic device. This electrolyte coverage may extend such that subsequent metal depositions overlay it. RF sputtering is one preferred method of vacuum deposition of the electrolyte.

In a further step of an embodiment of the present invention, an anode current collector (acc) (600) may be deposited over a portion of the electrolytic layer (500) as depicted in FIG. 1. This layer may be positioned directly above the cathode (300) region with an additional deposited tab opposed to the ccc (200) and an extension that makes contact with the metallic contact layer (400). This acc layer may comprise several materials including, for example, lithium. Methods of vacuum deposition of this layer on the appropriate surface may include, for example, DC sputtering or evaporation.

As a further step of an embodiment of the present invention, as depicted in FIG. 1, a multi-layer laminate (700) may be bonded to the surface of the exemplary electronic device configurations set forth above. This multi-layer laminate (700) may include one or more of the following types of layers: sealant layer for thermal or adhesive bonding, tie layer, metallic layer, plastic or glass barrier layer, or a slip layer for outside damage protection. Bonding may be achieved by using several means including, for example, compressive force and elevated temperature in a roll laminator or vacuum bag laminator. Openings for access to the contact area may be pre-cut in the multi-layer laminate structure prior to bonding.

When a metal layer is included in the laminate of an embodiment of the present invention, it may be desirable to control the amount of depression in the laminate structure, such that shorting through the laminate does not occur. Depression control, especially at the edges, may depend on the amount of pressure applied, the temperature at which the process is performed, the conformity of the compressive surface, and the amount of time for which these forces are applied. In addition, a conformal material may be overlaid upon the multi-layer laminate structure of an embodiment of the present invention to displace air during processing.

Various embodiments of encapsulation approaches of the present invention with termination means are presented as examples in the following descriptions and figures.

FIG. 1 illustrates one embodiment of the present invention employing deposited metal contacts and a mechanical termination on an exemplary thin-film battery. In this example, a multi-layer laminate (700) may be bonded to the surface of the battery with pre-cut openings over the deposited metal contact areas. Here, the extended ccc (200) and the metallic contact layer (400) may not have been atomically bonded to the substrate such that robust wire-bonding may be produced. Hence, a mechanical connector (800) may be affixed to the surface of the battery. With metallic substrates, however, it may be desirable to take care when affixing a mechanical connector to avoid damaging any insulating layers.

Figure 2:
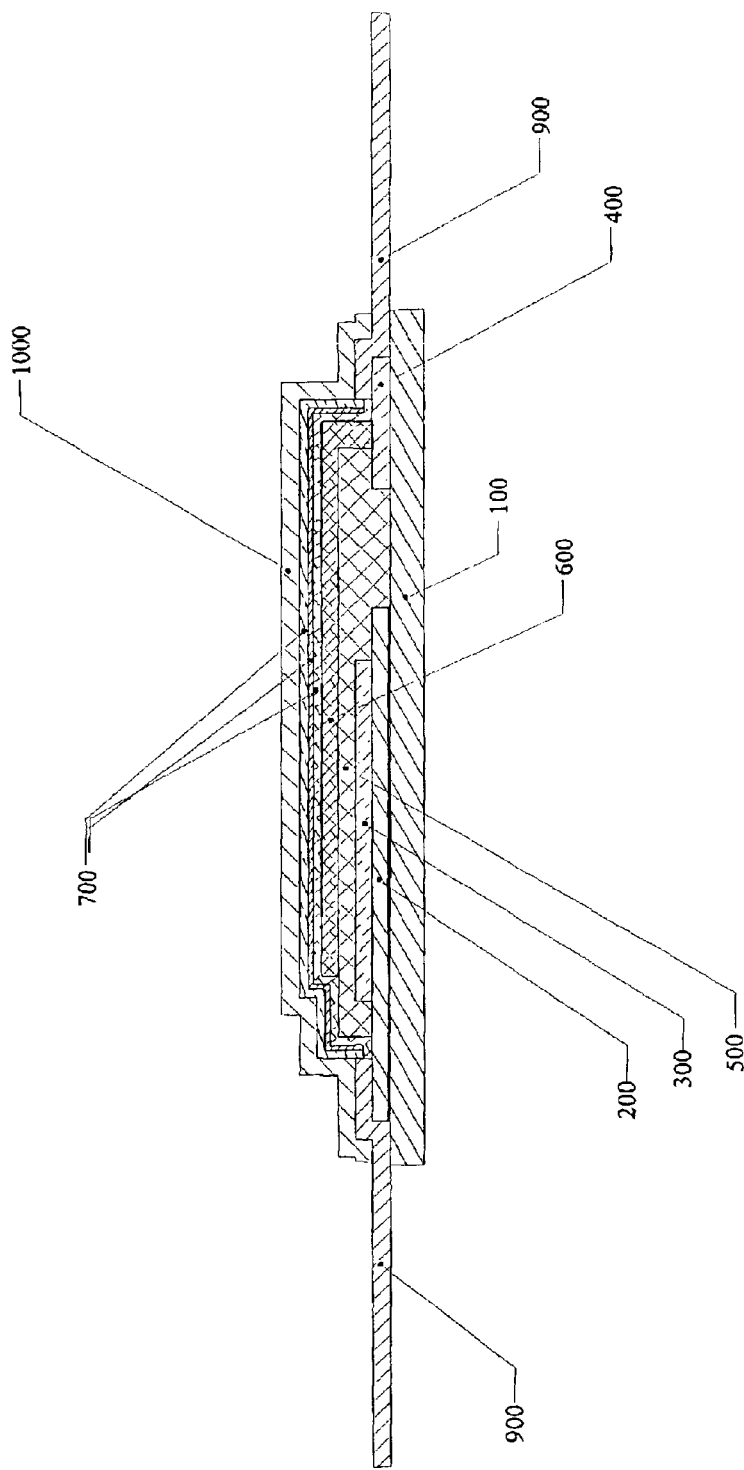
FIG. 2 is a side view cutaway diagram of an embodiment of the present invention including a deposited metallic contact with conductive adhesive-backed metallic tape termination.

FIG. 2 illustrates another embodiment of the present invention employing deposited metal contacts, a conductive adhesive backed metal tape, and an over-layer laminate. In this example, a multi-layer laminate (700) may be bonded to the surface of a battery with pre-cut openings over the deposited metal contacts. Here, the extended ccc (200) and the metallic contact layer (400) may not have been atomically bonded to the substrate such that robust wire-bonding may be produced. Hence, an adhesive backed conductor tape (900) may be affixed to the surface. Any such adhesive-backed conductor tape may be used including, for example, 3M 1181 EMI Shielding Tape. An outer encapsulant (1000) may be applied to enhance the prolonged adhesion of the adhesive-backed conductor tape (900). The outer encapsulant layer (1000) may be the same material as the multi-layer laminate (700). It may, however, be advantageous to use a simpler, more economical structure.

Figure 3:
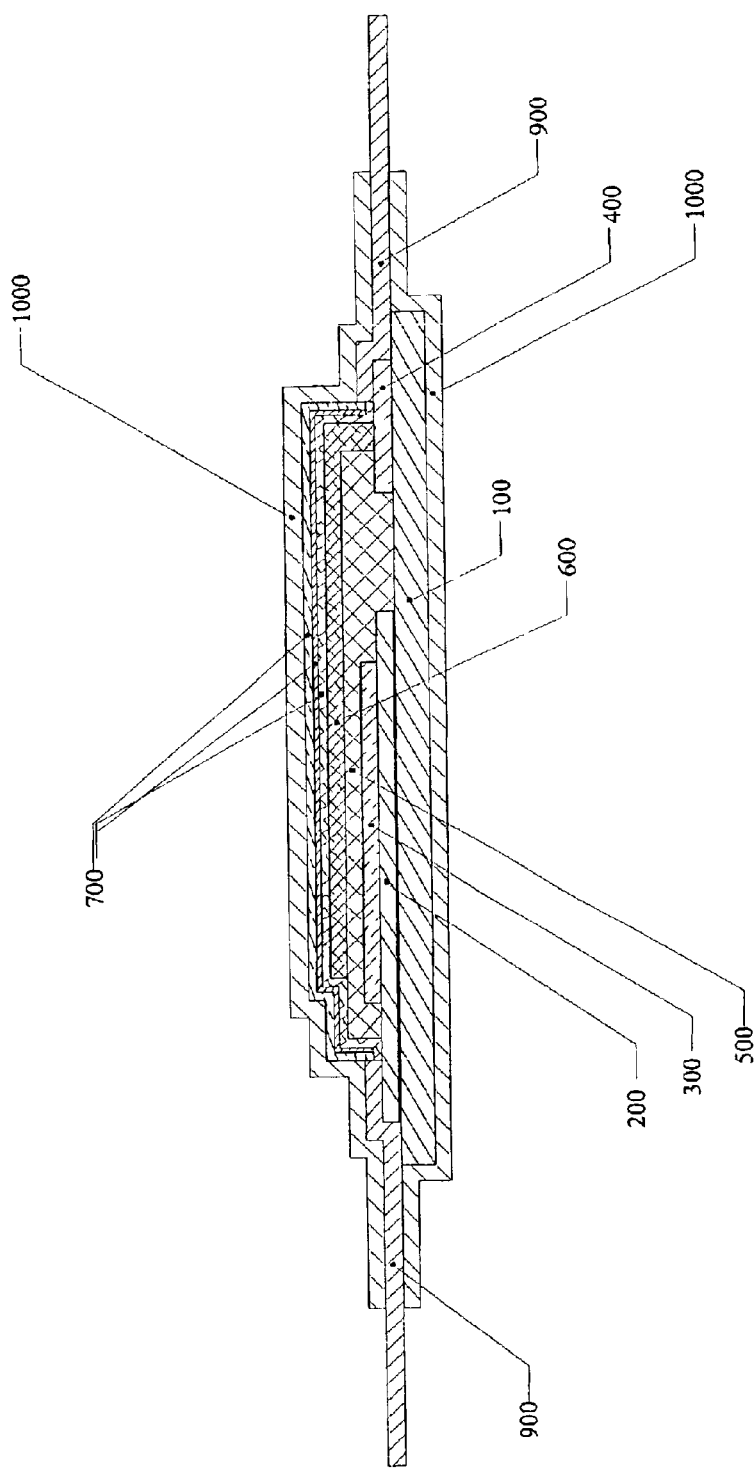
FIG. 3 is a side view cutaway diagram of an embodiment of the present invention including a deposited metallic contact with conductive adhesive-backed metallic tape termination and dual-sided laminate structure.

FIG. 3 illustrates another embodiment of the present invention employing deposited metal contacts, a conductive adhesive backed metal tape, and an over-layer laminate applied to both sides of a battery. In this example, a multi-layer laminate (700) may be bonded to the surface of the battery with pre-cut openings over the deposited metal contacts. In this case, the extended ccc (200) and the metallic contact layer (400) may not have been atomically bonded to the substrate so that robust wire-bonding may be produced. For this reason, an adhesive backed conductor tape (900) may be affixed to the surface. Any such adhesive-backed conductor tape may be used, including, for example, 3M 1181 EMI Shielding Tape. An outer encapsulant (1000) may then be applied to ensure the prolonged adhesion of the adhesive-backed conductor tape (900). The outer encapsulant (1000) may be the same material as the multi-layer laminate (700). A more robust package may be achieved by bonding to the battery surface, as described previously, and then embossing or crimping (for example thermally) the outer edges of the opposed outer encapsulant (1000) films. When metallic barrier layers are used, care may be taken to ensure that excessive pressure does not short to the adhesive-backed conductor tape (900) leads of the cell. Proper material-selection factory crimp parameters may be utilized without cell shorting. Here, the adhesive bond layer of the laminate may also act as an insulator for the leads.

Figure 4:
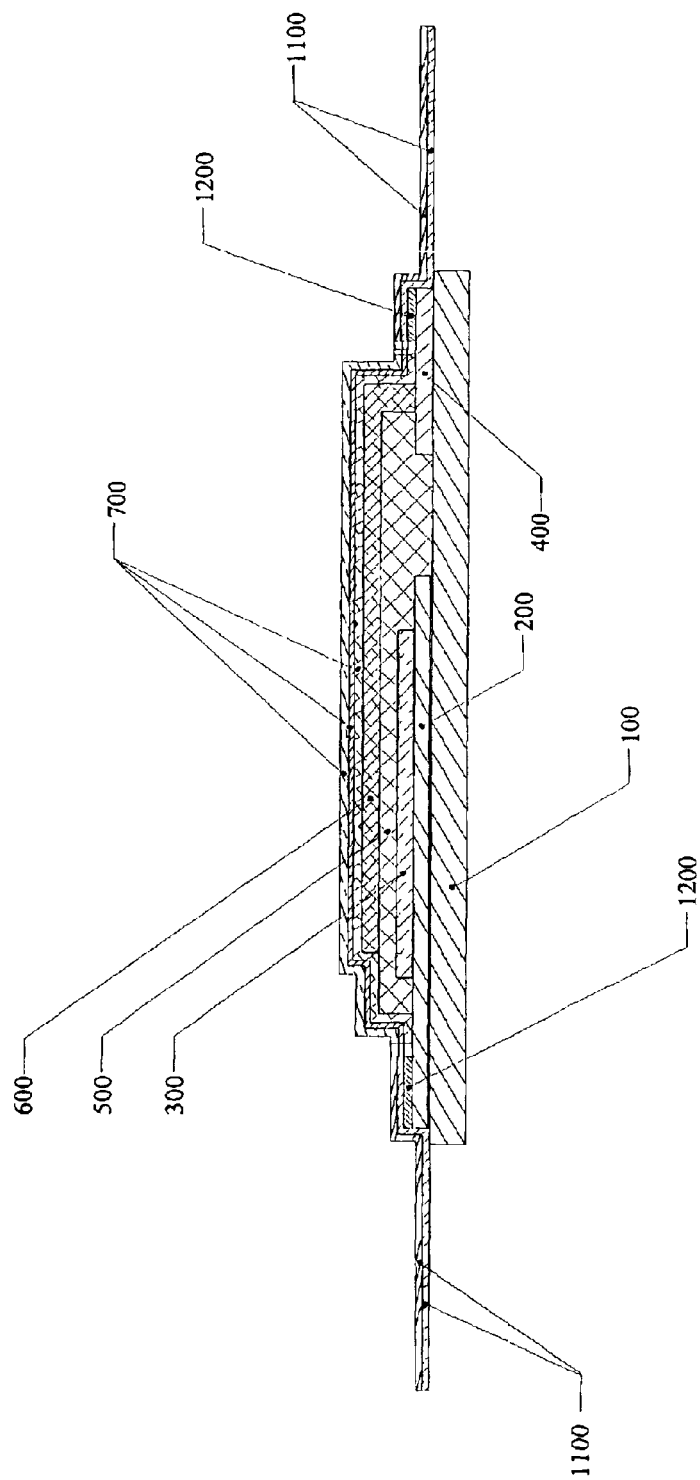
FIG. 4 is a side view cutaway diagram of an embodiment of the present invention including a deposited metallic contact with conductive ink tack-bonding copper-coated polyimide.

FIG. 4 illustrates yet another embodiment of the present invention employing deposited metal contacts, a copper-coated polyimide conductor strip tack-bonded with conductive ink, and the multi-layer laminate structure extended to provide strain relief or the contact. In this example, copper-coated polyimide (1100) may be tack-bonded to the deposited metal contacts with conductive ink (1200). A multi-layer laminate (700) may be bonded to the surface of the battery and may extend over the ink (1200) and copper-coated polyimide (1100) bond site to provide strain relief to the leads.

Figure 5:
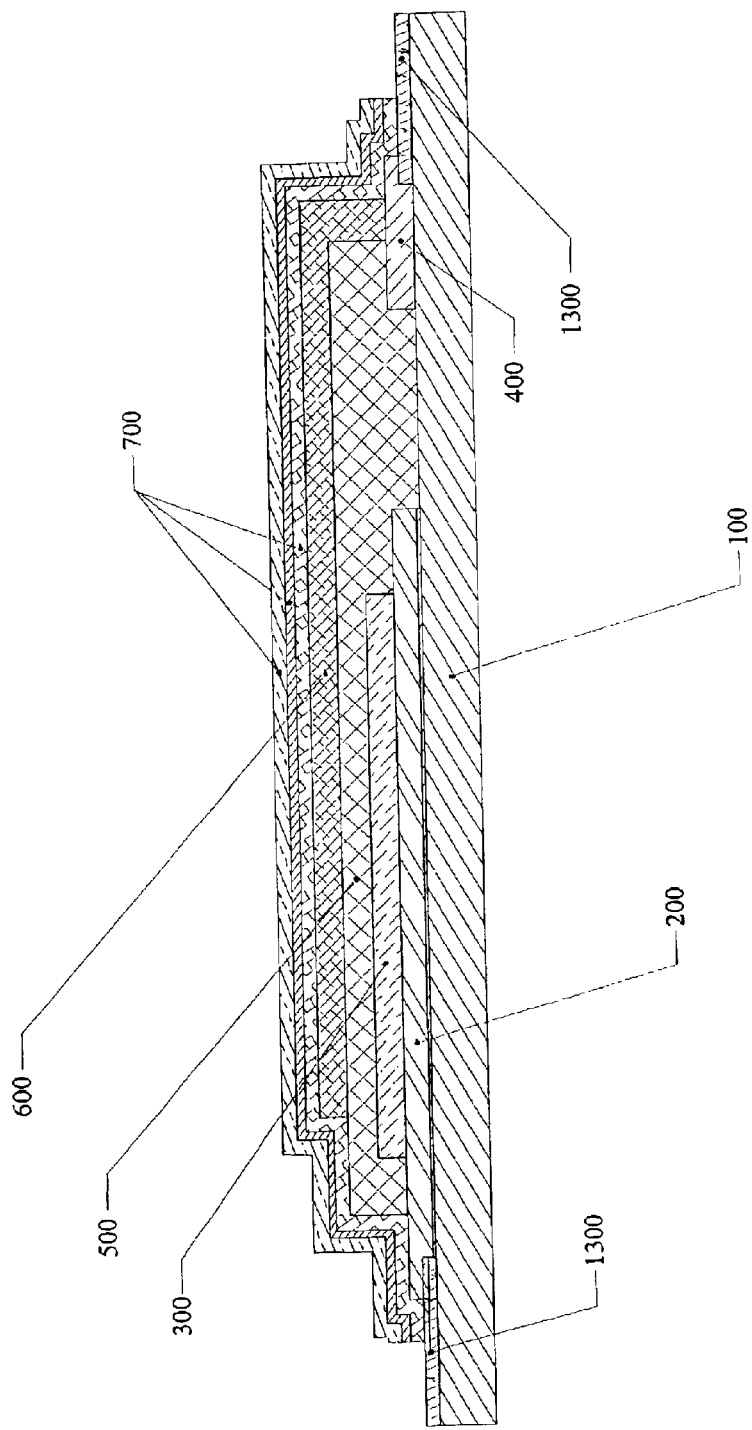
FIG. 5 is a side view cutaway diagram of an embodiment of the present invention including a wire-bondable metallic contact pad.

FIG. 5 illustrates an additional embodiment of the present invention employing deposited metal contacts contacting pre-deposited atomically bonded contacts. In this example, the substrate (100) may be selectively coated with a conductor composition paste that may be treated to provide an atomically bonded contact (1300). A multi-layer laminate (700) may be bonded to the surface of a battery. The multi-layer laminate(s) may have pre-cut openings over the atomically bonded contacts. Such contacts that are left exposed through the openings in the multi-layered laminate may be wire-bonded without further preparation.

Figure 6:
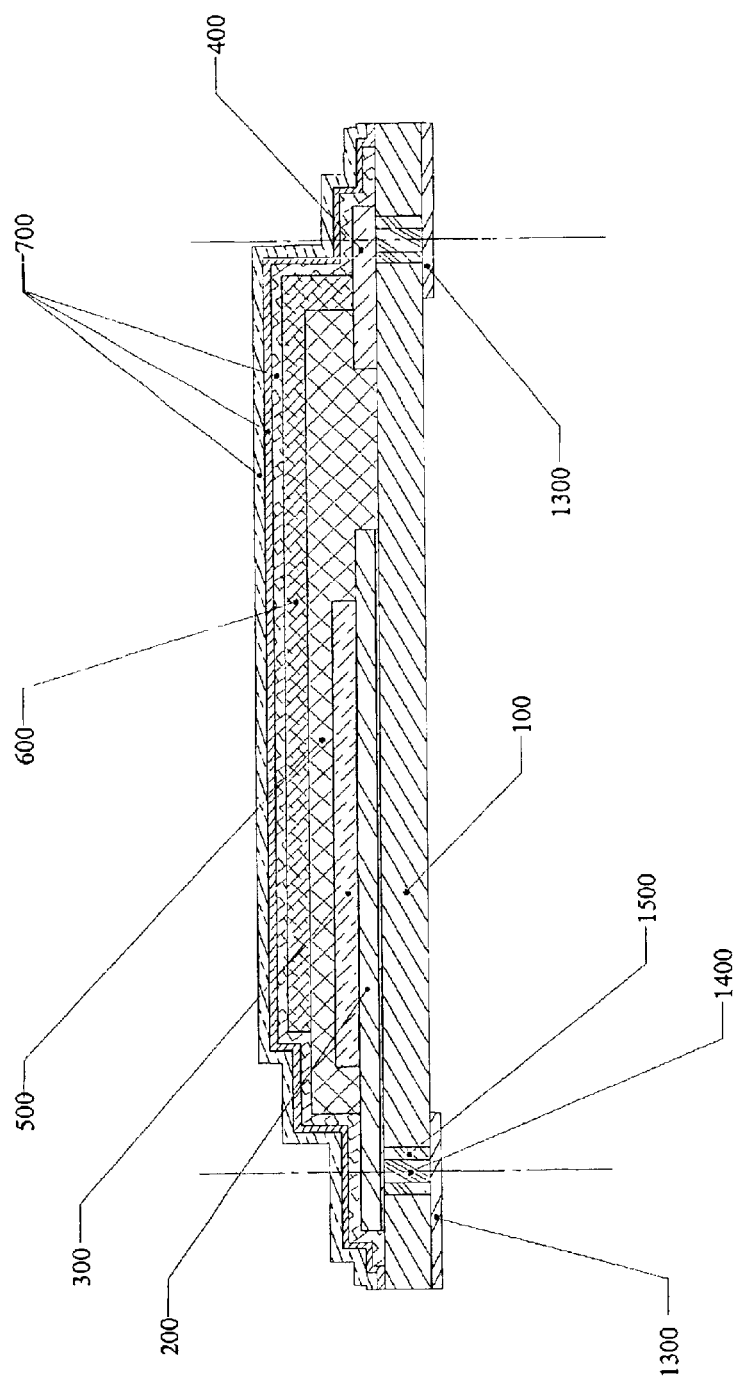
FIG. 6 is a side view cutaway diagram of an embodiment of the present invention including a metallic via (through-hole) with back-side wire-bond-able metallic contact pad.

FIG. 6 illustrates yet another embodiment of the present invention employing deposited metal contacts contacting pre-deposited metal-filled conductive through-holes. In this embodiment, the deposited contacts may contact atomically bonded contacts on the opposite side of a battery. In this example, the substrate (100) may be prepared with holes that may be filled with metal paste, then fired to provide a conductive through path or via (1400). The substrate (100) may be selectively coated with a conductor composition paste that may be treated to provide an atomically bonded contact (1300) on the opposite side of the substrate (100) from the deposited cell. A multi-layer laminate (700) may be bonded to the top surface of the battery. Here, extensive pressure may be applied along the edges and there may be little risk of shorting.

Other embodiments of the invention will be apparent to those skilled in the art from consideration of the specification and the practice of the invention disclosed herein. It is intended that the specification and examples be considered as exemplary only, with a true scope and spirit of the invention being indicated by the following claims.

What is claimed is:

1. An encapsulated electrochemical apparatus comprising:
    a device having a first surface; and
    a first laminate bonded to at least a substantial portion of said first surface;
    wherein said device comprises less than about 50 percent encapsulated gas per unit volume.
2. The apparatus of claim 1, wherein said device further comprises less than about 10 percent encapsulated gas per unit volume.
3. The apparatus of claim 1, wherein said device further comprises less than about 1 percent encapsulated gas per unit volume.
4. A method for producing an encapsulated electrochemical device comprising the steps of:
    providing an electrochemical device;
    providing a first laminate layer; and
    bonding said first laminate layer to a substantial portion of a first surface of said electrochemical device;
    wherein said encapsulated device comprises less than about 50 percent encapsulated gas per unit volume.
5. The method of claim 4, wherein said encapsulated device further comprises less than about 10 percent encapsulated gas per unit volume.
6. The method of claim 4, wherein said encapsulated device further comprises less than about 1 percent encapsulated gas per unit volume.
7. A method for producing an encapsulated electrochemical device comprising the steps of:
    providing an electrochemical device;
    providing a first laminate layer;
    bonding said first laminate layer to a substantial portion of a first surface of said electrochemical device; and
    displacing air by using compliant sheet materials on an opposite side of said first laminate from said device during at least a portion of said step of bonding.
8. A method for producing an encapsulated electrochemical device comprising the steps of:
    providing an electrochemical device;
    providing a first laminate layer;
    bonding said first laminate layer to a substantial portion of a first surface of said electrochemical device; and
    displacing air by using a vacuum laminator during at least a portion of said step of bonding.
9. A method for producing an encapsulated electrochemical device comprising the steps of:
    providing an electrochemical device;
    providing a first laminate layer;
    bonding said first laminate layer to a substantial portion of a first surface of said electrochemical device; and
    monitoring shorting by depression control.
10. The method of claim 9, wherein said step of monitoring shorting comprises the steps of:
    monitoring the amount of pressure applied;
    monitoring the temperature at which the process is performed;
    monitoring the conformity of the compressive surface; and
    monitoring the amount of time for which these forces are applied.
11. A method for fabricating an encapsulated electrochemical device comprising:
    providing a multi-layer laminate film comprising:
        a bonding layer capable of bonding to the electrochemical device;
        a barrier layer forming a substantially impervious layer that is not conductive to ions of the active metal of the electrochemical device; and
        a non-releasable top coating upon the barrier layer; and
    attaching said bonding layer to said electrochemical device.
12. The method of claim 11, wherein said barrier layer is in contact with at least one electrical terminal of said electrochemical device.
13. The method of claim 11, wherein said electrochemical device comprises a thin-film electrochemical device.
14. The method of claim 11, wherein said electrochemical device is selected from the group consisting of a lithium battery, a lithium-ion cell, a lithium-free cell, or a metallic lithium anode cell.
15. The method of claim 11, wherein said multi-layer laminate film has pre-cut openings corresponding to the location of terminals of said electrochemical device.
16. The method of claim 11, wherein said electrochemical device includes a substrate with conducting vias through said substrate providing terminals on the opposite side of the substrate with respect to the location of said multi-layer laminate film.
17. The method of claim 11, wherein said bonding layer is a slip-type film layer.
18. The method of claim 11, further comprising attaching an electrical conductor to terminals of said electrochemical device by electrical bonding.
19. The method of claim 18, wherein said attaching comprises a technique selected from the group consisting of wire-bonding, using conductive adhesive, using conductive epoxy, using conductive ink, using cured conductor composition paste, spot welding, soldering, and ultrasonic bonding of metals.
20. The method of claim 18, wherein a metallically coated polymer element is tack-bonded with conductive ink to said electrical conductor.

21. The method of claim 20, wherein said bonding layer is adapted to cover said ink and said metallically coated polymer element.

22. The method of claim 11, wherein an electrical conductor extends through an edge seal of said bonding layer.

23. The method of claim 22, wherein a metallically coated polymer element is tack-bonded with conductive ink to said electrical conductor.

24. The method of claim 23, wherein said bonding layer is adapted to cover said ink and said metallically coated polymer element.

25. The method of claim 11, wherein said bonding layer is bonded by a technique selected from the group consisting of compressive force lamination, elevated temperature lamination, roll lamination, and vacuum bag lamination.

26. The method of claim 11, wherein said device comprises less than about 50 percent encapsulated gas per unit volume.

27. The method of claim 11 wherein said device comprises less than about 10 percent encapsulated gas per unit volume.

28. The method of claim 11 wherein said device comprises less than about 1 percent encapsulated gas per unit volume.

29. An encapsulated electrochemical device comprising:
   an electrochemical device having a first surface;
   a multi-layer laminate film provided on said first surface, said multi-layer film further comprising:
      a bonding layer bonded to said first surface of said electrochemical device;
      a barrier layer forming a substantially impervious layer that is not conductive to ions of the active metal of the electrochemical device on said bonding layer; and
      a non-releasable top coating upon said barrier layer.

30. The device of claim 29, wherein said barrier layer is in contact with at least one electrical terminal of said electrochemical device.

31. The device of claim 29, wherein said electrochemical device comprises a thin-film electrochemical device.

32. The device of claim 29, wherein said electrochemical device is selected from the group consisting of a lithium battery, a lithium-ion cell, a lithium-free cell, and a metallic lithium anode cell.

33. The device of claim 29, said electrochemical device further comprising terminals and wherein said multi-layer laminate film has pre-cut openings corresponding to the location of said terminals of said electrochemical device.

34. The device of claim 29, wherein said electrochemical device further comprises a substrate with conducting vias through said substrate that serve as terminals on the opposite side of the substrate with respect to the location of said multi-layer laminate film.

35. The device of claim 29, wherein said bonding layer is a slip-type film layer.

36. The device of claim 29, further comprising an electrical conductor electrically bonded to terminals provided on said electrochemical device.

37. The device of claim 36, further comprising a metallically coated polymer element tack-bonded with conductive ink to said electrical conductor.

38. The device of claim 37, wherein said bonding layer is adapted to cover said ink and said metallically coated polymer element.

39. The device of claim 36, wherein said electrical bond is selected from the group consisting of wire-bond, conductive adhesive, conductive epoxy, conductive ink, cured conductor composition paste, spot weld, solder, and ultrasonic bond of metals.

40. The device of claim 29, further comprising an electrical conductor extending through an edge seal formed by the interface of said first surface and said bonding layer.

41. The device of claim 40, comprising a metallically coated polymer element tack-bonded with conductive ink to said electrical conductor.

42. The device of claim 41, wherein said bonding layer is adapted to cover said ink and said metallically coated polymer element.

43. The device of claim 29, wherein said bonding layer is bonded by a technique selected from the group consisting of compressive force lamination, elevated temperature lamination, roll lamination, and vacuum bag lamination.

44. The device of claim 29, wherein said device comprises less than about 50 percent encapsulated gas per unit volume.

45. The device of claim 29, wherein said device comprises less than about 10 percent encapsulated gas per unit volume.

46. The device of claim 29, wherein said device comprises less than about 1 percent encapsulated gas per unit volume.

\* \* \* \* \*

UNITED STATES PATENT AND TRADEMARK OFFICE
CERTIFICATE OF CORRECTION

PATENT NO. : 6,916,679 B2
DATED : July 12, 2005
INVENTOR(S) : Shawn W. Snyder et al.

It is certified that error appears in the above-identified patent and that said Letters Patent is hereby corrected as shown below:

Title page,
Item [75], Inventors, should read:
-- Shawn W. Snyder, Golden, CO (US);
   Pawan K. Bhat, Littleton, CO (US);
   Shefali Jaiswal, Lakewood, CO (US) --.

Signed and Sealed this

Thirtieth Day of August, 2005

JON W. DUDAS
*Director of the United States Patent and Trademark Office*